United States Patent
Kung

(10) Patent No.: US 6,396,944 B1
(45) Date of Patent: May 28, 2002

(54) INSPECTION METHOD FOR LEVENSON PSM MASK

(75) Inventor: Chun-Hung Kung, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/234,094

(22) Filed: Jan. 19, 1999

(51) Int. Cl.⁷ .................................................. G06K 9/00
(52) U.S. Cl. ........................................ 382/144; 382/145
(58) Field of Search ................................ 382/144, 143, 382/145, 147; 356/345, 351, 354

(56) References Cited

U.S. PATENT DOCUMENTS

| | | | |
|---|---|---|---|
| 4,618,938 A | * 10/1986 | Sandland et al. | 364/552 |
| 5,439,767 A | 8/1995 | Yamashita et al. | 430/30 |
| 5,446,540 A | * 8/1995 | Lin | 356/345 |
| 5,563,702 A | * 10/1996 | Emery et al. | 356/73 |
| 5,786,112 A | 7/1998 | Okamoto et al. | 430/5 |
| 6,084,716 A | * 7/2000 | Sanada et al. | 359/629 |

* cited by examiner

Primary Examiner—Andrew W. Johns
Assistant Examiner—Seyed Azarian
(74) Attorney, Agent, or Firm—George O. Saile; Stephen B. Ackerman; Larry J. Prescott

(57) ABSTRACT

Methods for a die to die and a die to database inspection of phase shifting masks is described. A layer of partially transmitting material, such as an anti-reflection coating, is formed on the mask covering the phase shifting mask elements. The mask is then illuminated by a light source and the light transmitted through the mask is detected. Defects in the pattern of phase shifting mask elements will cause a difference in the amount of light transmitted through the defect when compared to a defect free phase shifting mask element. This difference can be used to perform a die to die inspection or a die to database inspection of the pattern of phase shifting mask elements.

18 Claims, 4 Drawing Sheets

US 6,396,944 B1

INSPECTION METHOD FOR LEVENSON PSM MASK

BACKGROUND OF THE INVENTION (1) Field of the Invention

This invention relates to a method of die to die or die to database inspection of phase shifting masks for defects in the transparent phase shifting mask elements.

(2) Description of the Related Art

In order to inspect masks having phase shifting mask elements, some means must be employed to make defects in the phase shifting mask elements detectable. The detectability of these defects is made difficult because the phase shifting mask elements are transparent and difficult to distinguish from the transparent mask substrate. The phase shifting mask elements are often the same material as the transparent mask substrate.

U.S. Pat. No. 5,446,540 to Lin describes the use of a phase-contrast microscope for the inspection of a phase shifting mask.

U.S. Pat. No. 5,786,112 to Okamoto et al. describes a method of inspecting photomasks having phase shifting mask elements using a first anomaly discrimination step, a second anomaly discrimination step, and an anomaly extraction step in inspecting the mask.

U.S. Pat. No. 5,439,767 to Yamashita et al. describes a method of inspection a phase shifter for transmittance error and phase shift angle error by exposing a layer of photoresist several times at varying focus, developing the photoresist, and measuring the width of the lines in the resulting pattern.

SUMMARY OF THE INVENTION

Levenson type phase shifting masks use quartz or other transparent phase shifting mask elements. The quality of these masks is very important so that inspection of the masks for mask defects is very important. Inspection of the masks is quite difficult, however, since the light transmission through the phase shifting mask elements is the same as through the transparent mask substrate. The phase shifting mask elements and the transparent mask substrate are often formed of the same material.

It is a principle objective of this invention to provide a method of inspecting for defects in transparent phase shifting mask elements using die to die inspection.

It is another principle objective of this invention to provide a method of inspecting for defects in transparent phase shifting mask elements using die to data base inspection.

These objectives are achieved by forming a layer of partially transmitting material, such as a layer of anti-reflective material, on the mask covering the phase shifting mask elements. The mask is then illuminated by a light source and the light transmitted through the mask is detected. Defects in the pattern of phase shifting mask elements will cause a difference in the amount of light transmitted through the defect when compared to a defect free phase shifting mask element. This difference can be used to perform a die to die inspection or a die to database inspection of the pattern of phase shifting mask elements.

DESCRIPTION OF THE PREFERRED EMBODIMENTS

Figure 1:
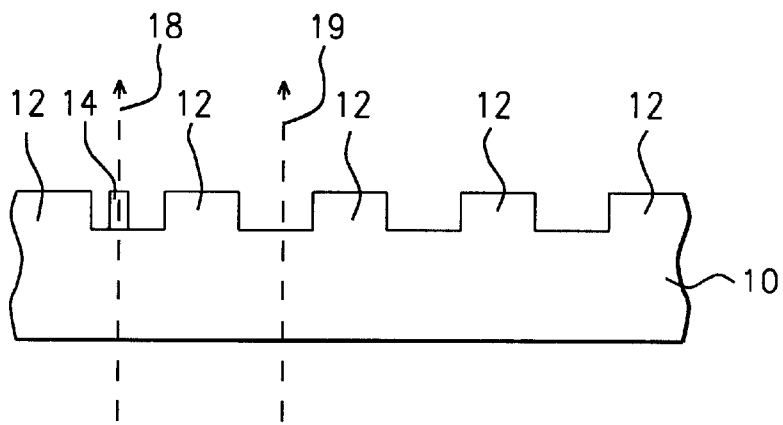
FIG. 1 shows a cross section view of a phase shifting mask having phase shifting mask elements formed of the same material as the transparent mask substrate and defects in the mask.

Refer now to FIGS. 1–8 for a description of the embodiment of the die to die method of this invention for inspecting phase shifting masks for defects. FIG. 1 shows a cross section view of a Levenson type phase shifting mask without opaque mask elements. The mask comprises a transparent mask substrate 10, formed of a material such as quartz, and phase shifting mask elements 12 which are formed of the same material as the transparent mask substrate. The mask shown in FIG. 1 has a defect 14 which consists of phase shifting material which should have been removed but is present in a region of the mask which should have no phase shifting material present. The defect in this invention is extraneous phase shifting material and not contamination of other materials. It is difficult to detect the defect because the defect 14, the transparent mask substrate 10, and the phase shifting material 12 are transparent material. A light beam 18 passing through the transparent mask substrate 10 and the defect 14 will not be attenuated any more than a light beam 19 passing through the transparent mask substrate only.

Figure 2:
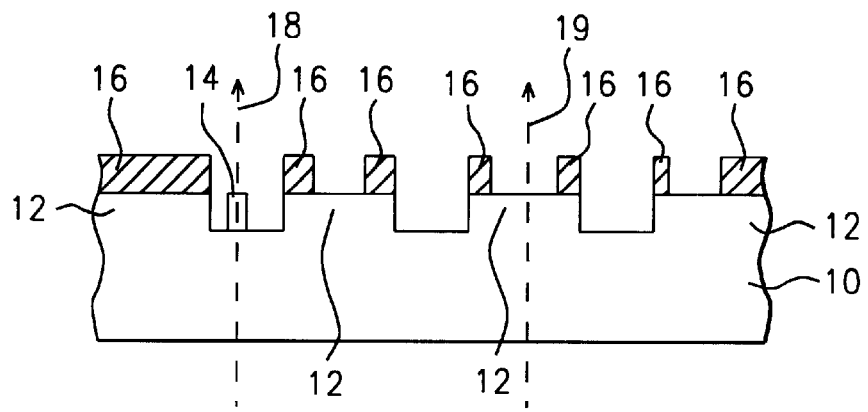
FIG. 2 shows a cross section view of a phase shifting mask having phase shifting mask elements formed of the same material as the transparent mask substrate, opaque mask elements, and defects in the mask.

FIG. 2 shows a cross section view of a Levenson type phase shifting mask with opaque mask elements. The mask comprises a transparent mask substrate 10, opaque mask elements 16, and phase shifting mask elements 12 which are formed of the same material as the transparent mask substrate. The transparent mask substrate is formed of a material such as quartz and the opaque mask elements are formed of a material such as chrome. The mask shown in FIG. 2 has a defect 14 which consists of phase shifting material which should have been removed but is present in a region of the mask which should have no phase shifting material present. The defect in this invention is extraneous phase shifting material and not contamination of other materials. It is difficult to detect the defect because the defect 14, the transparent mask substrate 10, and the phase shifting material 12 are transparent material. A light beam 18 passing through the transparent mask substrate 10 and the defect 14 will not be attenuated any more than a light beam 19 passing through the transparent mask substrate only.

Figure 3:
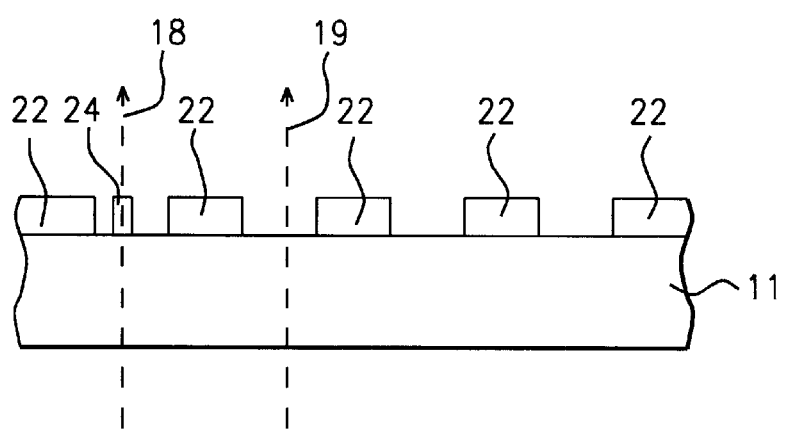
FIG. 3 shows a cross section view of a phase shifting mask having phase shifting mask elements formed on a transparent mask substrate and defects in the mask.

FIG. 3 shows a cross section view of another Levenson type phase shifting mask without opaque mask elements. This mask comprises a transparent mask substrate 11, formed of a material such as quartz, and phase shifting mask elements 22 which are formed of different transparent material from the transparent mask substrate. The mask shown in FIG. 3 has a defect 24 which consists of phase shifting material which should have been removed but is present in a region of the mask which should have no phase shifting material present. A light beam 18 passing through the transparent mask substrate 11 and the defect 24 will not be attenuated any more than a light beam 19 passing through the transparent mask substrate 11 only. Those skilled in the art will readily recognize that the method of this invention for inspecting the mask of FIG. 3 is the same as the method for inspecting the mask of FIG. 1 and the invention will be described using the mask of FIG. 1.

Figure 4:
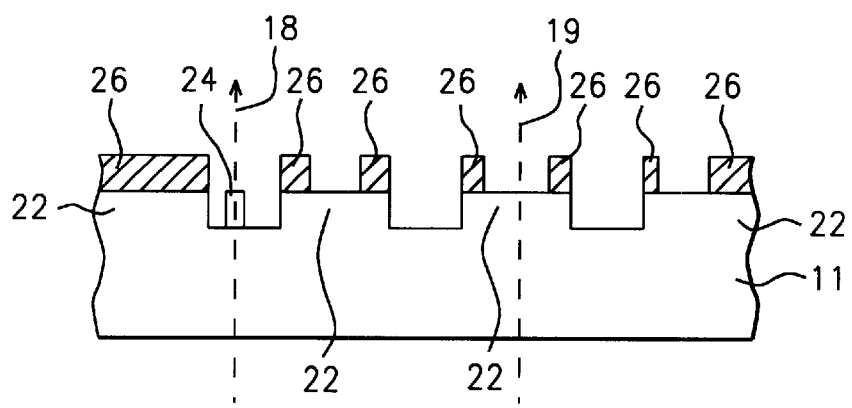
FIG. 4 shows a cross section view of a phase shifting mask having phase shifting mask elements formed on a transparent mask substrate, opaque mask elements, and defects in the mask.

FIG. 4 shows a cross section view of a Levenson type phase shifting mask with opaque mask elements. The mask comprises a transparent mask substrate 11, opaque mask elements 26, and phase shifting mask elements 22 which are formed of different transparent material as the transparent mask substrate. The mask shown in FIG. 4 has a defect 24 which consists of phase shifting material which should have been removed but is present in a region of the mask which should have no phase shifting material present. The defect in this invention is extraneous phase shifting material and not contamination of other materials. A light beam 18 passing through the transparent mask substrate 11 and the defect 24 will not be attenuated any more than a light beam 19 passing through the transparent mask substrate only. Those skilled in the art will readily recognize that the method of this invention for inspecting the mask of FIG. 4 is the same as the method for inspecting the mask of FIG. 2 and the invention will be described using the mask of FIG. 2.

Figure 5:
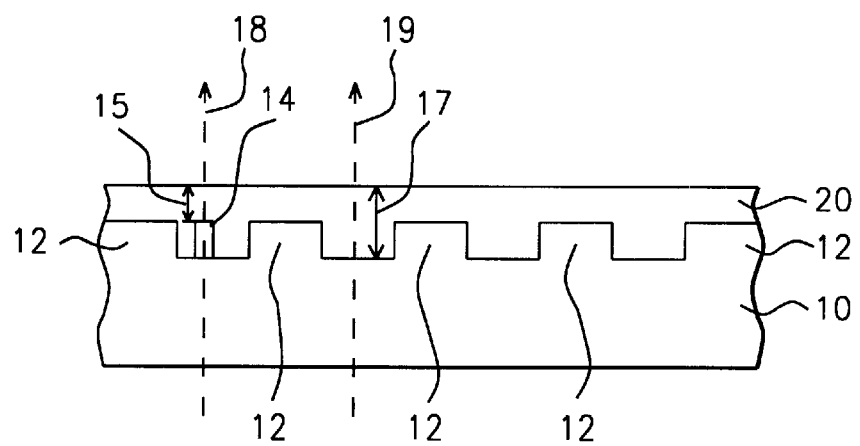
FIG. 5 shows a cross section view of a phase shifting mask having phase shifting mask elements formed of the same material as the transparent mask substrate, defects in the mask, and a layer of partially transmitting material formed on the mask.
Figure 6:
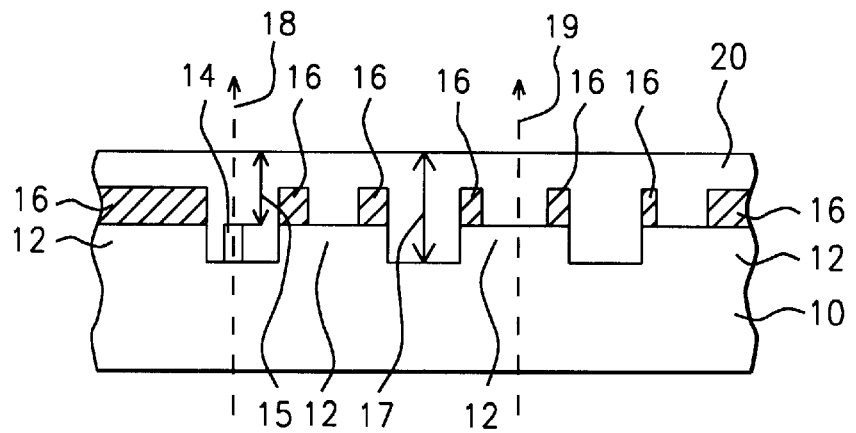
FIG. 6 shows a cross section view of a phase shifting mask having phase shifting mask elements formed of the same material as the transparent mask substrate, opaque mask elements, defects in the mask, and a layer of partially transmitting material formed on the mask.

The key step of the invention is shown in FIGS. 5 and 6. FIG. 5 shows a cross section view of the phase shifting mask without opaque mask elements with a mask defect 14. A layer of partially transmitting material 20, such as an anti-reflection coating, is formed on the mask covering the phase shifting mask elements 12 and the defect 14. When the mask is illuminated, the light 18 transmitted through the defect 14 has a shorter path 15 in the partially transmitting material than the path 17 of the light 19 passing through a corresponding part of the mask without a defect. This shorter path in the partially transmitting material will cause the light passing through the defect 14 to have less attenuation than light 19 not passing through the defect 14. This difference in attenuation makes the defect detectable.

FIG. 6 shows a cross section view of the phase shifting mask with opaque mask elements 16 with a mask defect 14. A layer of partially transmitting material 20, such as an anti-reflection coating, is formed on the mask covering the phase shifting mask elements 12 and the defect 14. When the mask is illuminated, the light 18 transmitted through the defect 14 has a shorter path 15 in the partially transmitting material than the path 17 of the light 19 passing through a corresponding part of the mask without a defect. This shorter path in the partially transmitting material will cause the light passing through the defect 14 to have less attenuation than light 19 not passing through the defect 14. This difference in attenuation makes the defect detectable.

Figure 7:
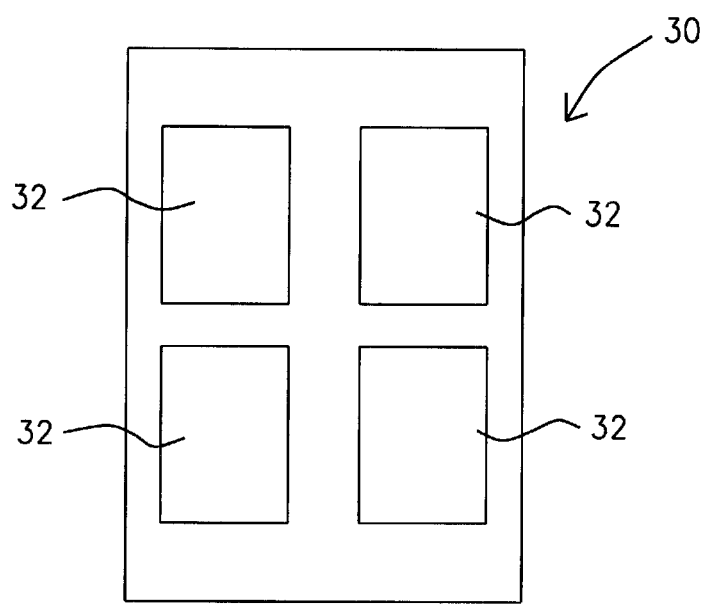
FIG. 7 shows a top view of a mask having four die positions.
Figure 8:
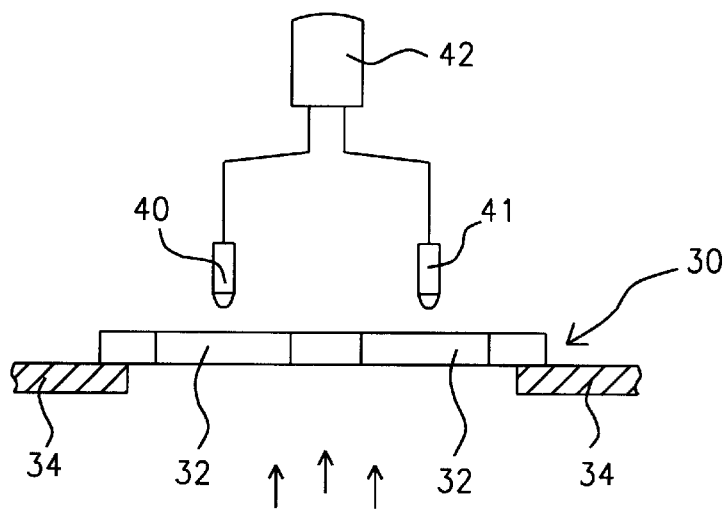
FIG. 8 shows a schematic diagram of an inspection set up to perform a die to die mask inspection.

FIG. 7 shows a mask 30 having a number of identical dies 32, in this example four. The die contains an image for an integrated circuit or die. The image in each die 32 is identical to the image in the other dies 32. As shown in FIG. 8, the mask 30 is placed in a mask holder 34 and illuminated with a light source 36. A first detector 40, such as a first objective lens, detects the light transmitted through a segment of one of the dies. A second detector 41, such as a second objective lens, detects the light transmitted through the corresponding segment of another of the dies. The first detector 41 and second detector 43 can be connected to a visual display unit 42 or other image processing unit where the image of the first detector 40 can be compared with the image of the second detector 41. The first detector 40, the second detector 41, and the mask 30 can be moved so that the entire mask can be scanned and a die to die inspection of the mask can be carried out.

Refer now to FIGS. 1–7 and 9 for a description of the embodiment of the die to database method of this invention for inspecting phase shifting masks for defects. FIGS. 1–4 show the phase shifting masks with defects and are the same as described in the preceding embodiment. As in the preceding embodiment, the key step of the invention is shown in FIGS. 5 and 6. FIG. 5 shows a cross section view of the phase shifting mask without opaque mask elements with a mask defect 14. A layer of partially transmitting material 20, such as an anti-reflection coating, is formed on the mask covering the phase shifting mask elements 12 and the defect 14. When the mask is illuminated, the light 18 transmitted through the defect 14 has a shorter path 15 in the partially transmitting material than the path 17 of the light 19 passing through a corresponding part of the mask without a defect. This shorter path in the partially transmitting material will cause the light passing through the defect 14 to have less attenuation than light 19 not passing through the defect 14. This difference in attenuation makes the defect detectable.

FIG. 6 shows a cross section view of the phase shifting mask with opaque mask elements 16 with a mask defect 14. A layer of partially transmitting material 20, such as an anti-reflection coating, is formed on the mask covering the phase shifting mask elements 12 and the defect 14. When the mask is illuminated, the light 18 transmitted through the defect 14 has a shorter path 15 in the partially transmitting material than the path 17 of the light 19 passing through a corresponding part of the mask without a defect. This shorter path in the partially transmitting material will cause the light passing through the defect 14 to have less attenuation than light 19 not passing through the defect 14. This difference in attenuation makes the defect detectable.

Figure 9:
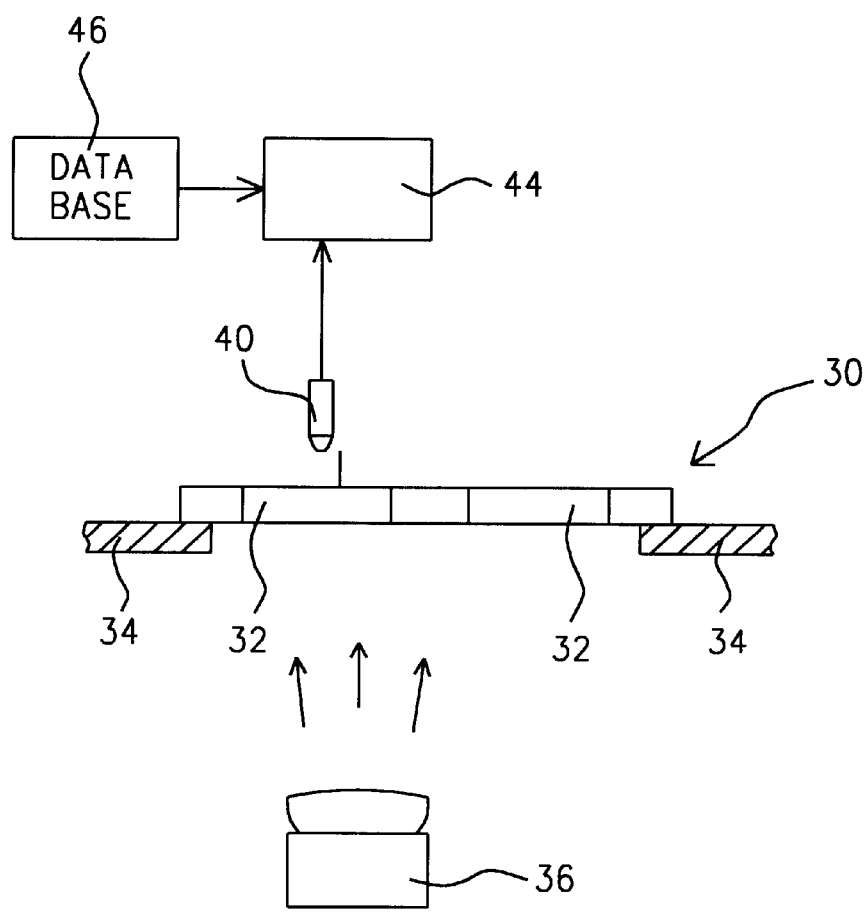
FIG. 9 shows a schematic diagram of an inspection set up to perform a die to data base mask inspection.

FIG. 7 shows a mask 30 having a number of identical dies 32, in this example four. The die contains an image for an integrated circuit or die. The image in each die 32 is identical to the image in the other dies 32. As shown in FIG. 9, the mask 30 is placed in a mask holder 34 and illuminated with a light source 36. A detector 40, such as an objective lens, detects the light transmitted through a segment of one of the dies. The detector 40 is connected to an image processing unit 44. The mask database 46 is also fed to the image processing unit 44 where a die to database comparison of the mask image can be made. The detector 40 and the mask 30 can be moved so that the entire mask can be scanned and a die to database inspection of the mask can be carried out.

While the invention has been particularly shown and described with reference to the preferred embodiments thereof, it will be understood by those skilled in the art that various changes in form and details may be made without departing from the spirit and scope of the invention.

What is claimed is:

1. A method of inspecting phase shifting masks, comprising:

providing a mask having a first number of identical dies wherein each of said identical dies comprises phase shifting mask elements formed on a transparent mask substrate and each of said identical dies has a second number of segments;

forming a layer of partially transmitting material on said mask covering said transparent mask substrate and said phase shifting mask elements;

providing a light source;

illuminating a first identical die and a second identical die of said mask by said light source;

providing a first detector, wherein said first detector detects light intensity;

providing a second detector, wherein said second detector detects light intensity;

selecting one of said second number of segments of said first identical die and the corresponding segment of said second identical die;

detecting a first light intensity, using said first detector, wherein said first light intensity is the intensity of the light transmitted through said selected segment of said first identical die and through that part of said layer of partially transmitting material directly over said selected segment of said first identical die;

detecting a second light intensity using said second detector, wherein said second light intensity is the intensity of the light transmitted through the corresponding segment of said second identical die and through that part of said layer of partially transmitting material directly over said corresponding segment of said second identical die;

comparing said first intensity and said second intensity, thereby determining any difference between said first intensity and said second intensity;

moving said first detector and said second detector to select all of said second number of segments of said first identical die and all of said corresponding segments of said second identical die; and removing said layer of partially transmitting material.

2. The method of claim 1 wherein said layer of partially transmitting material is a layer of anti-reflective material.

3. The method of claim 1 wherein each of said identical dies further comprises opaque mask elements.

4. The method of claim 1 wherein said transparent mask substrate is quartz.

5. The method of claim 1 wherein said transparent mask substrate and said phase shifting mask elements are quartz.

6. The method of claim 1 wherein said phase shifting mask elements are transparent.

7. The method of claim 1 wherein said first detector comprises a first objective lens and said second detector comprises a second objective lens wherein said first objective lens and said second objective lens are identical.

8. The method of claim 1 wherein said first detector and said second detector comprise a visual display unit.

9. The method of claim 1 wherein said first detector and said second detector comprise an automatic image analyzer.

10. A method of inspecting phase shifting masks, comprising:

providing a mask having a number of first dies, wherein each of said dies comprises phase shifting mask elements formed on a transparent mask substrate and each of said dies has a second number of segments;

providing a mask database;

forming a layer of partially transmitting material on said mask covering said transparent mask substrate and said phase shifting mask elements;

providing a light source;

illuminating said mask by said light source;

providing a detector, wherein said detector detects light intensity;

selecting a die of said mask and a segment of said die;

detecting a first light intensity, wherein said first light intensity is the intensity of the light transmitted through said selected segment of said selected die and through that part of said layer of partially transmitting material directly over said selected segment of said selected die;

moving said detector to select all of said segments of said selected die;

comparing said first light intensity to said mask database for all of said segments of said selected die; and removing said layer of partially transmitting material.

11. The method of claim 10 wherein said layer of partially transmitting material is a layer of anti-reflective material.

12. The method of claim 10 wherein said mask further comprises opaque mask elements.

13. The method of claim 10 wherein said transparent mask substrate is quartz.

14. The method of claim 10 wherein said transparent mask substrate and said phase shifting mask elements are quartz.

15. The method of claim 10 wherein said phase shifting mask elements are transparent.

16. The method of claim 10 wherein said first detector comprises an objective lens and an automatic image analyzer.

17. The method of claim 10 wherein said detector comprises a visual display unit.

18. The method of claim 10 wherein said mask database is the database used to design said mask.

* * * * *